(12) United States Patent
Bouilly et al.

(10) Patent No.: US 11,649,826 B2
(45) Date of Patent: May 16, 2023

(54) MOUNT FOR PUMP EXTENSION MODULE

(71) Applicants: Herve Bouilly, Dortmund (DE); Franck Terrien, Dortmund (DE)

(72) Inventors: Herve Bouilly, Dortmund (DE); Franck Terrien, Dortmund (DE)

(73) Assignee: WILO SE, Dortmund (DE)

( * ) Notice: Subject to any disclaimer, the term of this patent is extended or adjusted under 35 U.S.C. 154(b) by 0 days.

(21) Appl. No.: 17/557,255

(22) Filed: Dec. 21, 2021

(65) Prior Publication Data

US 2022/0196019 A1 Jun. 23, 2022

(30) Foreign Application Priority Data

Dec. 23, 2020 (EP) .................................... 20020651

(51) Int. Cl.
*H05K 5/02* (2006.01)
*F04D 13/06* (2006.01)
*F04D 29/62* (2006.01)

(52) U.S. Cl.
CPC ..... *F04D 13/0686* (2013.01); *F04D 13/0693* (2013.01); *F04D 29/62* (2013.01); *H05K 5/0221* (2013.01)

(58) Field of Classification Search
CPC ..................................................... G06F 1/168
See application file for complete search history.

(56) References Cited

U.S. PATENT DOCUMENTS

| 5,850,999 A | 12/1998 | Gross | |
|---|---|---|---|
| 2013/0107445 A1* | 5/2013 | Reber | G06F 1/1632 361/679.41 |
| 2014/0293553 A1* | 10/2014 | Stanelli | H02S 40/34 361/730 |

FOREIGN PATENT DOCUMENTS

| DE | 8703832.3 U1 | 7/1987 |
|---|---|---|
| DE | 102019103637 A1 | 8/2019 |
| EP | 1063751 A1 | 12/2000 |

* cited by examiner

*Primary Examiner* — Jerry Wu
(74) *Attorney, Agent, or Firm* — Andrew Wilford

(57) ABSTRACT

A terminal box for a centrifugal pump is releasably connectable to an electronic extension module by a locking element. A pluggable electric interface extends through an opening from an underside of the base plate into the terminal box to electrically connect the pump control for establishing a data link. The locking element is slidable in the cavity and is movable manually from a first position to a second position and by a tool from this second position to this first position. It also has on a first side a resilient latch engaging with either a first recess of the terminal box and holding the locking element in the first position, or a second recess of the terminal box holding the locking element in the second position. Thus the locking element frees the module for plugging-in in the first position, and arrests the module in the second position.

14 Claims, 6 Drawing Sheets

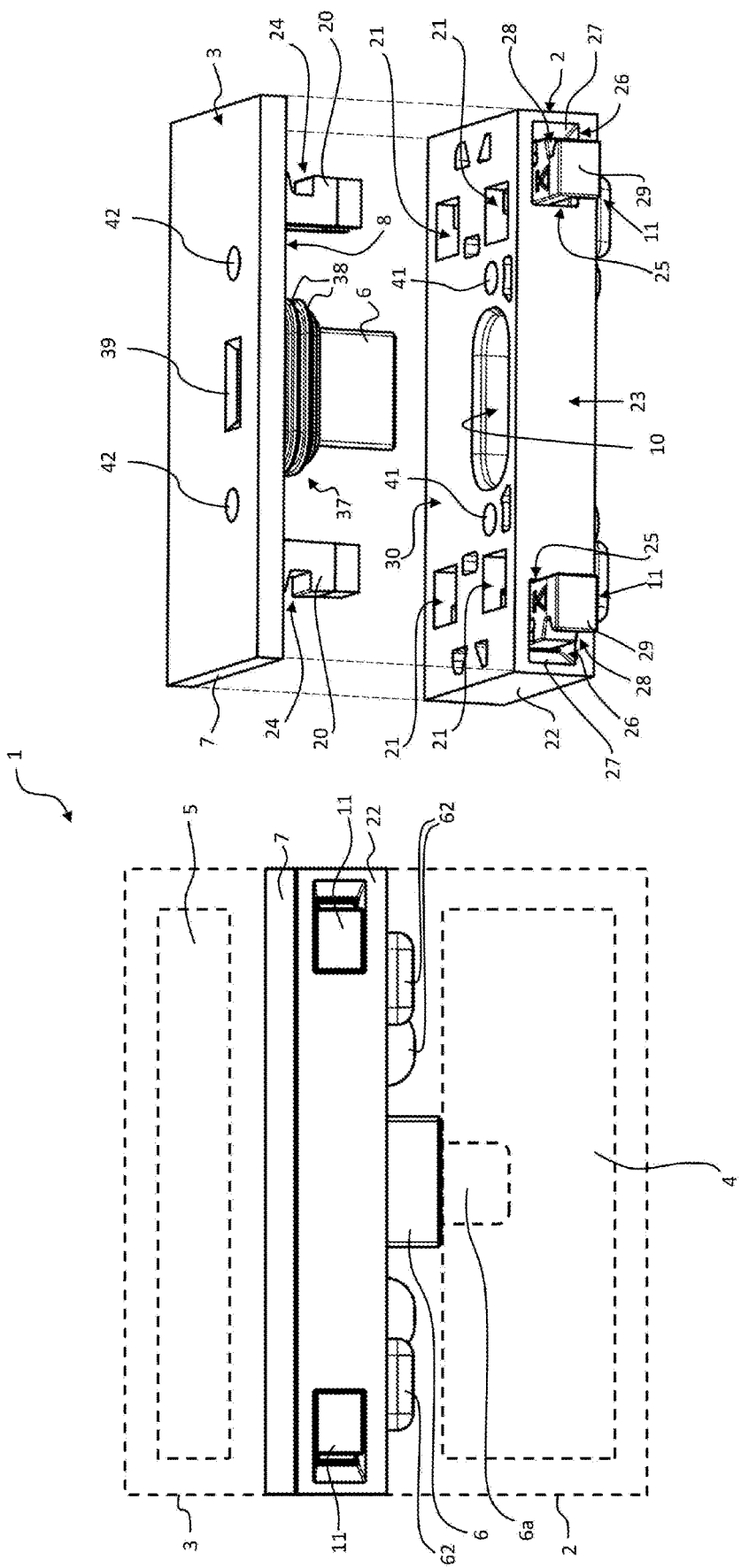

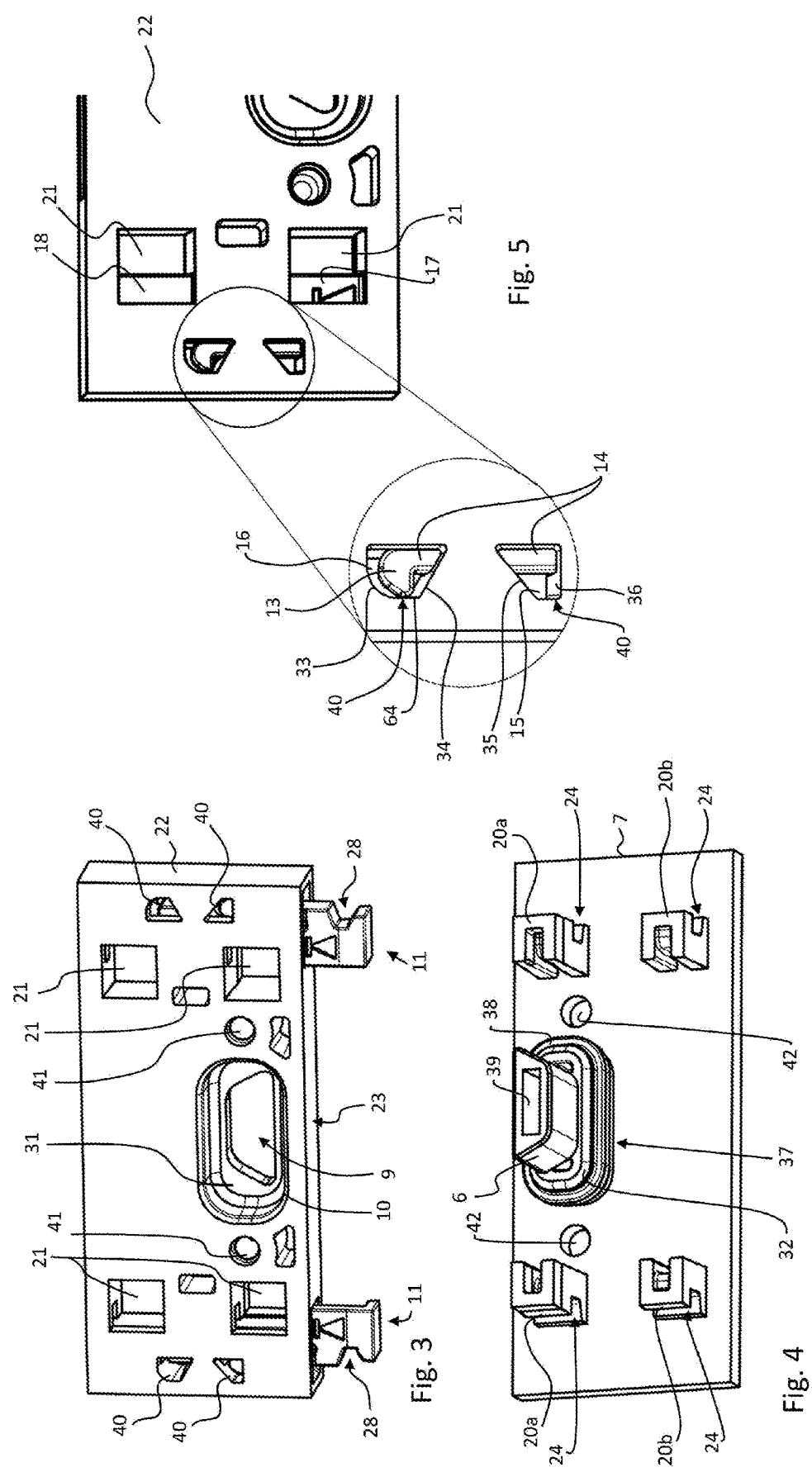

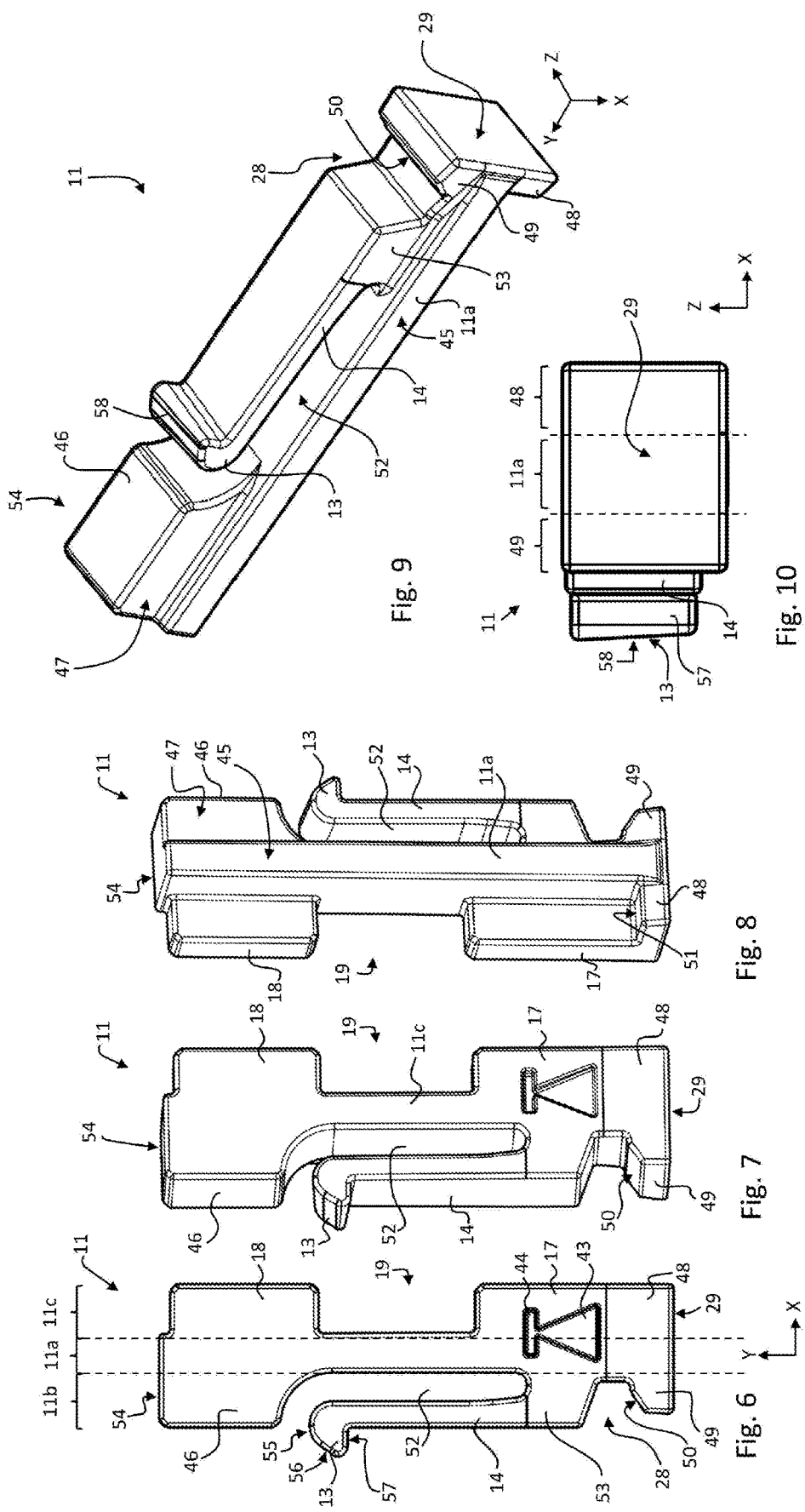

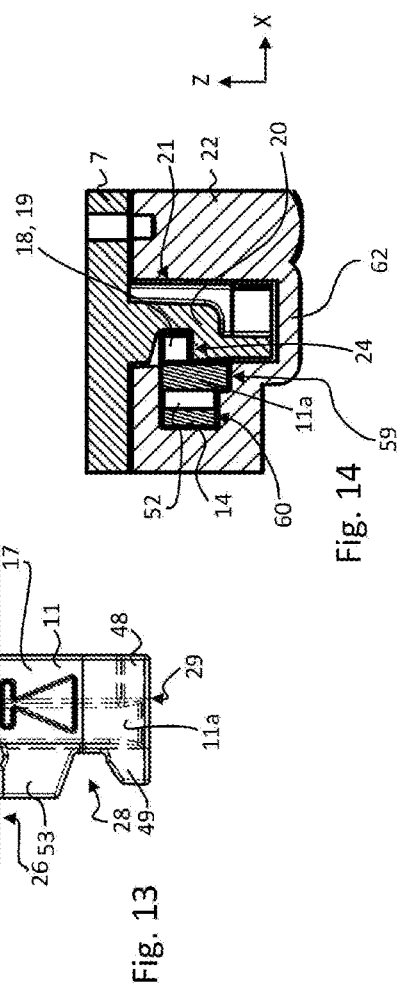
Fig. 14
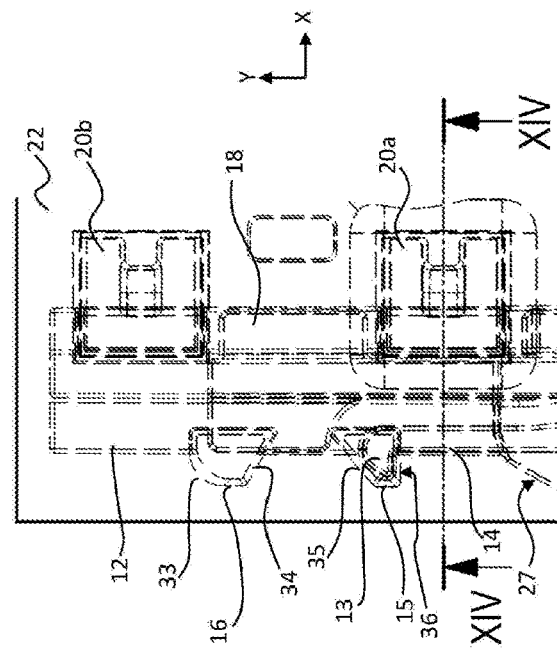
Fig. 13
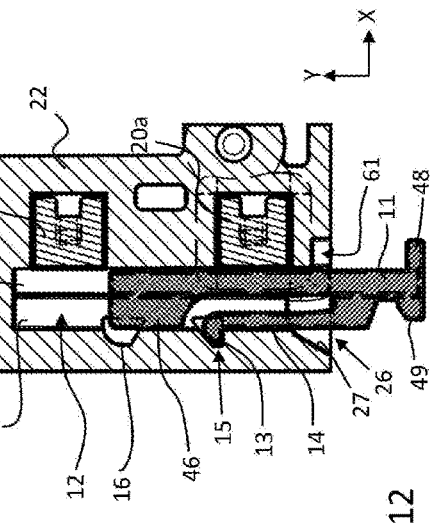
Fig. 11
Fig. 12

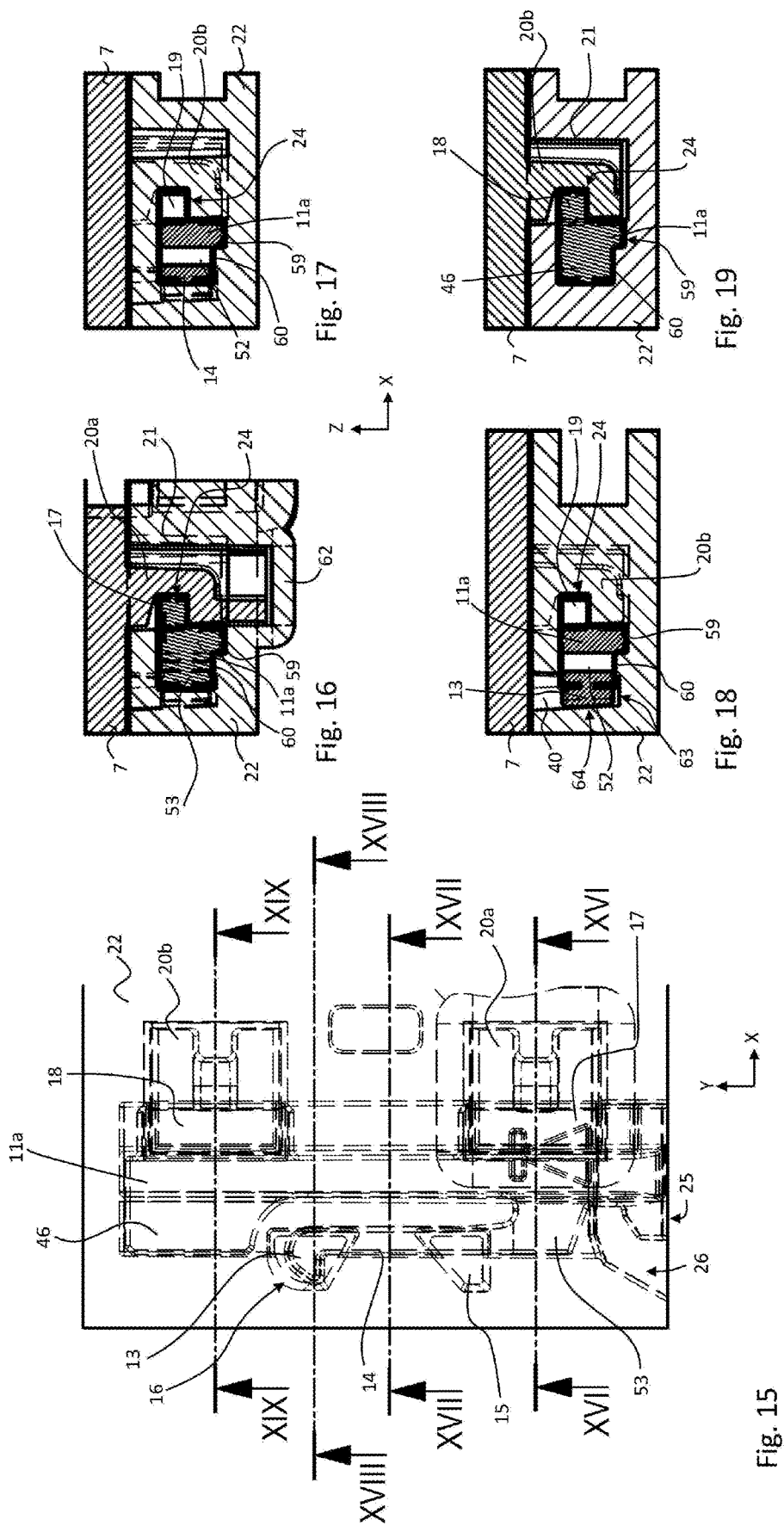

MOUNT FOR PUMP EXTENSION MODULE

FIELD OF THE INVENTION

The present invention relates to a pump extension module. More particularly this invention concerns of an electronic extension module of a circulator pump's control electronics at a terminal box housing the pump electronics.

BACKGROUND OF THE INVENTION

A terminal box for a centrifugal pump holds a pump control, and an electronic extension module extends the pump control by at least one additional hardware and/or software function, and at least one locking element securely holds the module on the terminal box, the module being removably mountable on the terminal box and having a pluggable electric interface extending from the underside of a base plate through an opening into the terminal box to electrically connect the pump control for establishing a data link.

Modules for extending the range of functions of a centrifugal pump's control unit are generally known. For example, the company WILO SE offers a function module, also called IF module (IF=interface), under part number 2097810 for its centrifugal-pump series named "Stratos" that expands the control electronics of this pump by a serial communication interface for BACnet in order to be able to connect the centrifugal pump to a building automation system. The IF module provides both the electrical connection (here RS485) for connecting the pump to a BACnet and the necessary communication protocol. A similar function module is offered by WILO SE under part number 2097808 that achieves a corresponding extension of the pump through the industry standard MODBUS. Thus, a user can optionally supplement the centrifugal pump and specifically adapt it to his needs and the local communication infrastructure. The two function modules are plugged alternatively into the same electrical interface of the centrifugal pump unit.

Meeting current and future customer needs requires a steady increase in the functional scope of centrifugal pumps or their pump electronics, especially with regard to wired or wireless communication interfaces. As existing communication technologies continue to develop (e.g. mobile communications like 2G (GSM)→3G (UMTS)→4G (LTE Advanced)→5G; Bluetooth→Bluetooth Low Energy) and new technologies (ZigBee, enOcean, RFID) are added, there is also a demand for rapid availability of functionally enhanced centrifugal pumps on the market, which is difficult to meet due to the necessary product development time and, in particular, the required product certification, especially for radio-based communication technologies integrated in the pump electronics. Additionally, despite the increase in functionality, there is the desire to be cost-effective.

A solution that meets all these requirements is to provide functions or function groups on a modular or building block basis in the form of electronic extension module that supplement the main product, i.e. the centrifugal pump unit or its pump electronics. This reduces the development time and the duration until availability on the market, because the development can essentially be limited to a new electronic extension module. Furthermore, no recertification of the main product is required, as certification is limited to the electronic extension module. This means that new technologies can be combined with or integrated into the main product in a timely manner. Furthermore, since extension modules permits to equip the main product with specific functions or function groups on an "as needed basis" in a targeted manner, functionalities that are not required by a customer can be omitted from the main product, resulting in an overall cost saving.

Considering that the size of future extension modules cannot be anticipated as it depends on the space the electronics inside occupies that, in return, depend on the function or function groups the module provides as well as the technology implementing the function or functions, the module should be arranged outside the pump's terminal box. Consequently, the size of the terminal box can be kept small.

However, the externalization of functions or function groups into electronic extension modules requires certain demands on the electrical interface between the electronic expansion module and the pump electronics as well as on the arrangement or mounting of the expansion module at the terminal box. Among other things, the aspects of operational safety, robustness, susceptibility to faults, protection against contact, insulation, tightness, handling and fastening must be taken into account. Furthermore, a uniform mounting mechanism is desirable, so that different expansion modules, in particular differing in their size, can be plugged into the same electrical interface of the pump electronics and can be fixed easily and securely at the terminal box in the same manner.

OBJECTS OF THE INVENTION

It is therefore an object of the present invention to provide an improved mount for use between a pump terminal box and an electronic extension module.

Another object is the provision of such an improved mount for use between a pump terminal box and an electronic extension module that overcomes the above-given disadvantages, in particular that fulfils the mentioned needs.

SUMMARY OF THE INVENTION

According to the present invention, it is proposed an assembly comprising a terminal box for a centrifugal pump accommodating a pump control, an electronic extension module extending the pump control by at least one additional hardware and/or software function, and at least one locking element for securely holding the module at the terminal box where the module is removably mountable on the terminal box and has a pluggable electric interface extending from the underside of a base plate through an opening into the terminal box to electrically connect the pump control for establishing a data link. The locking element is slidably accommodated within a cavity and can be moved manually from a first position to a second position and returned from this second position to this first position by a tool. The first position is an open position enabling plugging the module at the terminal box, whereas the second position is a locking position preventing unplugging the module.

Furthermore, the locking element has, at a first side, a resilient latch engaging with either a first recess at the terminal box retaining the locking element in the first position, or a second recess at the terminal box retaining the locking element in the second position. The locking element is configured to give free way for plugging the module in the first position, and to arrest the module in the second position by at least one projecting bar on a second side of the locking element. The module has at least one post parallel to one another to the electric interface from the base plate, whereas the post is insertable through a hole into the cavity, when the locking element is in the first position, and the post has a notch for engaging with the bar in a form-fit manner, when the locking element is in the second position.

In a preferred embodiment, the latch is at the end of a resilient arm. In other words, the resilient arm enables the latch to be removed from the first or second recess by pushing the arm backward during movement of the locking element. An assembly of this kind is very simple, robust and reliable. Preferably, the other end of the arm extends integrally into a central core portion of the locking element.

The module can comprise at least one post on either side of the electric interface each of which has a notch for engaging with one locking element. In addition, the assembly further comprises two locking elements each of which having at least one respective bar engaging, in a form-fit manner, with the notch of a respective post, when the locking element is in the second position, so that the module cannot be unplugged again. This means that the extension module is fixed at two points, one point at either side of the electric interface. The two locking element can be arranged symmetrically with respect to the electric interface.

In a further development, additionally or alternatively to the previous embodiment, the module has two adjacent posts each having a notch, and the locking element or elements comprise(s) an overall longitudinal shape having two adjacent projecting bars each of which engaging with one of the notches of the adjacent posts in a form-fit manner in the second position. This means that the at least one locking element arrests the extension module at two points. In an embodiment having two locking elements, and two times two adjacent posts each having a corresponding notch, the extension module is fixed at four points at the terminal box. This embodiment is preferably used if the extension modules has a large housing.

Preferably, the latch has a leading head of rounded shape. This eases moving the locking element from the first to the second position and pushing the arm backward with little force.

In a preferred embodiment, the latch has the shape of a hook comprising a detention surface interacting with a front inner side wall of the first recess to be retained by the first recess. Correspondingly, the first recess can comprise a front inner side wall configured to prevent the latch being moved out of the cavity. In other words, this inner side wall is an abutment and, in cooperation with the hook shaped latch, limits movement of the locking element beyond the first position when it is moved from the second to the first position. It follows that the front inner side wall of the first recess keeps the latch within the first recess and, consequently, keeps the locking element in the first position, so that it cannot be removed inadvertently from or fall out of the cavity.

In an advantageous further development, the first recess can comprise a rear inner side wall configured to push the latch backward during movement from the first to the second position, more specifically at the beginning of this movement. Thus, when the locking element is pushed to move from the first to the second position, the leading head of the latch is pushed against the rear inner side wall of the first recess that deflects the acting force toward the locking element, resulting, thanks to the resilience of the arm, in an evasive action of the latch. The latch, with continued movement of the locking element into the cavity, slides along the rear inner side wall that pushes the latch increasingly backward to a core portion of the locking element thereby bending the arm. Consequently, the latch moves more and more out of the first recess. Thus, the rear inner side wall of the first recess contributes to easily moving the locking element from the first to the second position with little force. Preferably, this rear inner side wall is plain and extending at an oblique angle of lesser than 90° with regard to the locking direction, i.e. to this movement of the locking element from the first to the second position. For example, this angle may be between 30° and 60°, in particular about 45°.

In another advantageous further development, additionally or alternatively to the one described before, the second recess can comprise a front inner side wall configured to push the latch backward during movement from the second to the first position, more specifically at the beginning of this movement. Thus, when the locking element is pulled to move from the second to the first position, the detention surface of the latch is pushed against the front inner side wall of the second recess that deflects the acting force toward the locking element, resulting, thanks to the resilience of the arm, in an evasive action of the latch. The latch, with continued movement of the locking element out of the cavity, slides along the front inner side wall that pushes the latch increasingly backward to a core portion of the locking element thereby bending the arm. Consequently, the latch moves more and more out of the second recess. Thus, the front inner side wall of the second recess enables to move the locking element from the second to the first position when pulled out of the cavity by the tool. Preferably, this front inner side wall is plain and extending at an oblique angle of lesser than 90° with regard to the unlocking direction, i.e. to this movement of the locking element from the second to the first position. For example, this angle may be between 30° and 60°, in particular about 45°.

In the forgoing the expressions "front" and "rear" refer to the direction of movement of the locking element when it is moved from the first to the second position. In this direction, the object designated as "rear" is behind the object designated as "front."

In a preferred embodiment, the locking element has a longitudinal shape comprising a central core portion at opposing sides of which are arranged the at least one bar and the latch. In other words, the central core portion is between the projecting bar and the latch.

According to another aspect of the present invention, the underside of a central core portion of the locking element is slidable on a guide track at the lower side of the cavity. In other words, this guide track delimits the cavity, supports the locking element and contributes to keep it in position. Preferably, the guide track is a shaped area of the terminal box that opens to the cavity. The central core portion can lay within the guide track in a form fit manner. The central core portion can be that central core portion that is between the projecting bar and the latch.

In order to easily push and pull the locking element it can comprise, at one axial end, a head formed by an end area of a central core portion and a left and right side wing projecting therefrom at opposing sides. By the side wings, the axial end of the central core portion is enlarged to form an operating surface big enough to act on comfortably with a thumb, for example. Of course, the central core portion could also have a cross-section along its entire axial length that corresponds at least to the size of this operating surface, but the embodiment according to the invention leads to a considerable material saving in the manufacture of the locking element. Moreover, the side wings allow applying the tool behind the head to act on a side wing's rear surface in order to pull the locking element out of the cavity. The central core portion can be that central core portion that is slidable on the guide track and/or that is between the projecting bar and the latch.

Preferably, the cavity opens to an outer surface, especially to a front face of the terminal box via a window where the locking element, in the first position, projects from this outer surface, and in the second position, a head of the locking element is situated within the window. Thus, in the first position, the locking element is easily accessible and can be pushed by hands into the cavity. Furthermore, in the second position, the locking element is safely stowed, i.e. there are no projecting parts on which you can hurt yourself. In addition, for safety reasons, it is not possible to unlock the assembly by hand. The head of the locking element is preferably that one being formed by an end area of the central core portion and a left and right side wing projecting therefrom at opposing sides.

To ease application of the tool, the window can have an extension area at one side to insert a flat end of the tool into a space behind a side wing of the head. In other words, the window is bigger than the head. This enables to lever the locking element out of the cavity.

The invention further relates to a centrifugal pump having a pump electronics and an extension module that is plugged into the pump electronics and locked according to the invention. As mentioned above, there may be at least a first extension module having a first housing size and at least a second extension module having a second housing size where the second housing size is larger than the first housing size. More specifically, the surface area of the lower side of the housing of the first extension module is larger than the surface area of the lower side of the housing of the second extension module.

Nevertheless, according to the invention, the kind of locking of this first and second extension module is identical in such a way that either the first or the second extension module can be plugged into the pump electronics and locked in the same manner by pushing the locking element or elements from the first position to the second position. In other words, the spatial arrangement of the locking elements in relation to the post or posts is the same for the first and second extension module. In a first example, the first extension module may have two posts, whereas the second extension module may have four posts. Preferably, the posts can be symmetrically arranged with regard to the electric interface. In this case, on the side of the terminal box, there will be four holes to insert the posts of both the first and second extension module.

Furthermore, there will be two locking elements each having two projecting bars to lock either the first or the second extension module. However, as the first extension module has only has two posts, the second projecting bar of each locking element is not acting. In a another example, the mounting mechanism is formed by four posts at each of the first and second extension module and two locking elements at the side of the terminal box. The posts can be arranged in or near the corners of the underside of the housing of the smaller first extension module, whereas in the case of the second extension module, due to its structurally larger housing, at least two of the locking elements are set back from the corners of the underside of this housing. As can be seen, although the housing of the first and second extension module may be different, they both fit to the mounting mechanism according to the present invention.

It is also an object of the invention to provide a set comprising at least a first and a second extension module of the aforementioned type wherein the surface area of the underside of the first extension module is larger than the surface area of the underside of the second extension module, but the electrical interface and the spatial arrangement of the locking elements with respect to the electrical interface are identical in the two extension modules.

Further objects, features, advantages, characteristics and effects of the invention will become more apparent from the following detailed description of embodiments of the present invention when considered in conjunction with the accompanying figures.

It should be noted that, in the context of the present description, the terms "have," "comprise," "comport" or "include" in no way exclude the presence of further features. Furthermore, the use of the indefinite article with an object does not exclude its plural.

BRIEF DESCRIPTION OF THE DRAWING

The above and other objects, features, and advantages will become more readily apparent from the following description, reference being made to the accompanying drawing in which:

FIG. 1 is a front view of an assembly comprising the upper portion of a terminal box and the lower portion of an extension module mounted thereon when latched;

FIG. 2 is an exploded, perspective view of the upper portion of the terminal box and the lower portion of the extension module before assembly;

FIG. 3 is an isometric view of the top side of the terminal box in unlocked state of the locking elements;

FIG. 4 is an isometric view of the lower side of the extension module;

FIG. 5 is an enlarged, detailed view of the left side of the top side of the terminal box when latched of the locking element;

FIG. 6 is a plan view of the left locking element;

FIG. 7 is an isometric view of the top side of the left locking element;

FIG. 8 is an isometric view of the lower side of the left locking element;

FIG. 9 is an isometric view of the left side of the left locking element;

FIG. 10 is a front view of the left locking element;

FIG. 11 is an enlarged front view of the left side of the assembly of FIG. 1 in unlocked state showing section line XII-XII;

FIG. 12 is an axis-parallel cross-sectional view of the left side of the assembly of FIG. 1 in unlocked state, taken along section line XII-XII in FIG. 11;

FIG. 13 is an enlarged top view of the left side of the assembly of FIG. 1 in unlocked state showing section line XIV-XIV;

FIG. 14 is a radial cross-sectional view of the left side of the assembly of FIG. 1 in unlocked state, taken along section line XIV-XIV in FIG. 13;

FIG. 15 is an enlarged top view of the left side of the assembly of FIG. 1 when latched showing section lines XVI, XVII, XVIII and XIX at different axial depth positions;

FIG. 16 is a radial cross-sectional view of the left side of the assembly of FIG. 1 when latched, taken along section line XVI in FIG. 15;

FIG. 17 is a radial cross-sectional view of the left side of the assembly of FIG. 1 when latched, taken along section line XVII in FIG. 15;

FIG. 18 is a radial cross-sectional view of the left side of the assembly of FIG. 1 when latched, taken along section line XVIII in FIG. 15;

FIG. 19 is a radial cross-sectional view of the left side of the assembly of FIG. 1 when latched, taken along section line XIX in FIG. 15;

SPECIFIC DESCRIPTION OF THE INVENTION

Figure 25:
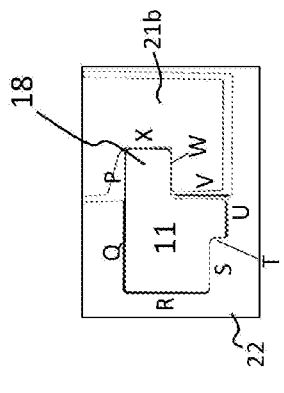
FIGS. 24 and 25: are simplified cross-sectional views.

FIG. 1 is a front view of an assembly 1 of a first plug-in electronic extension module 3 and a terminal box 2 where the module 3 is removably mounted on the terminal box 2. More specifically, FIG. 1 only shows a base plate 7 of this extension module 3 and the upper portion 22 of the terminal box 1 that forms a base frame for the mounting mechanism. A broken line indicates the housing of the module 3 and the terminal box 2. The terminal box 2 is part of a centrifugal pump (not shown) and accommodates in its housing a pump control 4 for controlling the pump and the speed of its electric motor. The electronic extension module 3 also accommodates in its housing electronics 5 extending the pump control 4 by at least one additional hardware and/or software function. For example, the additional function provided is a wired bus or a bluetooth interface. The assembly 1 further has two locking elements 11 symmetrically arranged in the upper portion 22 of the terminal box 2 for securely locking the module 3 to the terminal box.

As will become more apparent from FIG. 2, the extension module 3 has a pluggable electric interface 6, 6a projecting from the underside 8 of the base plate 7 and extending through an opening 9, 10 into the terminal box 2 to electrically connect the pump control 4 for establishing a data link. The electrical interface 6, 6a is formed by a socket 6 and electrical contacts 6a shown in FIG. 1. The electrical contacts 6a project from the socket 6 and are electrically plugged into respective electrical contacts at the side of the pump control 4. The electrical contacts 6a are in the form of electrical traces on a printed-circuit board. The printed-circuit board extends through a slot 39 in the base plate 7 into the socket 6.

The module 3 has two adjacent posts 20 on each side of the electric interface 6, 6a parallel to one another to the electric interface 6, 6a from the base plate 7. In the top of the upper portion 22 there are of four holes 21 complementary to the posts 20, i.e. two adjacent holes 21 on either side of the opening 9, 10 for the electric interface 6, 6a. Each of the two adjacent holes 21 opens into a common cavity 12 so that there are two cavities 12, one on either side of the opening 9, 10 for the electric interface 6, 6a. The posts 20 are insertable through these holes 21 into the respective cavities 12 when the locking elements 11 are in a first unlocked position, as shown in FIG. 2. The posts 20 each have a notch 24 so that the posts 20 have an overall hook shape. The notches 24 each open to the side. More specifically, the notches 24 of the right adjacent posts 24 open to the right, and the notches 24 of the left adjacent posts 24 open to the left. The function of the notches 24 is to engage with a bar of the respective locking element 11 in a form-fit manner when the locking elements 11 are in a second locked position.

Each one of the locking elements 11 is slidable in the respective cavity 12. The cavities 12 are formed by the two adjacent holes 21 opening at a window 25 in a front face 23 of the terminal box 2. The locking elements 11 have been inserted into the respective cavity 12, with an insert end 54 first, through the respective window 25. The locking element 11, in the first position projects from this front face 23 so that it can be pushed without a tool, i.e. by hand, in particular by a sharp push, from the first position to the second position. In the second position, a head 29 forming an axial end of the locking element 11 is recessed in the window 25 so that the locking element 11 can only be displaced out of this second position to the first position by a tool. This is done by inserting a flat end of the tool into a free space 28 adjacent the head 29 for levering the respective locking element 11 out of the cavity 12. In order to facilitate use of the tool, the window 25 is enlarged at the side of the free space 28 to form an extension area 26 whose side wall 27 is inclined to direct the flat end of the tool directly into the free space 28 behind the head 29.

As becomes more apparent from FIGS. 3 and 4, the socket 6 is concave and forms the slot 39 for the printed-circuit board. The outer shape of the socket is trapezoidal in cross section to prevent an inadvertent or intentional mismounting of the module 3. At its lower side, the socket 6 broadens to a base 32 carrying a gasket 37 comprising two parallel lips 38 as can be seen more clearly in FIG. 2. When the module is installed, the base 32 is accommodated within a trough 10 in the upper portion 22 of the terminal box 2 and sealed by the gasket 37. FIG. 3 shows that, in the lower side 31 of the trough 10 there is an opening 9 leading into the interior of the terminal box 2. The outer shape of this opening 9 corresponds to the shape and size of the socket 6 so as to form a form-fit connection of the "poka-yoke" principle.

Furthermore, the base plate 7 has holes 42 for screws as alternative or additional mounting option for the extension module. Respective screw holes 41 are provided in the top side of the terminal box 3.

Whereas in FIG. 2, the posts 20 are not shown in detail, FIG. 3 differentiates between front posts 20a and rear posts 20b viewed from the front face 23 of terminal box 2. The front posts 20a are next to the electrical interface 6, 6a and are substantially aligned with the socket 6 whereas the rear posts 20b have a greater spacing from the electric interface 6, 6a. The rear posts 20b are also aligned with each other.

FIG. 3 shows how the holes 21 open into the cavities 12 and are aligned with the locking elements 11 are in the first unlocked position. The bottom area of the cavities 12 aligned with the openings form a bottom closure 62 as shown in FIGS. 1 and 2. Thus, the cavities 12 are completely closed to the interior of the terminal box 2.

As can be seen from FIGS. 1, 2 and 3, the assembly 1 is symmetrical with regard to the center of the front face 23 of the terminal box 2. In other words, the right side of the upper portion 22 of terminal box 3 is mirror symmetrical to the left side. For that reason, only the left side is described in more detail hereinafter.

FIG. 5 shows the locking element 11 in the second latched position, completely engaged into the cavity 12. An enlarged view of functional areas 13, 14, 15, 16 of the cavity 12 and the locking element is also given in FIG. 5. In the following, the left locking element 11 and its cooperation with the functional areas 15, 16 of the cavity 12 is described hereinafter in conjunction with FIGS. 6 to 10 giving a more detailed view of the locking element 11.

The locking element 11 has, at a first side 11b (see FIG. 6), a resilient latch 13 engaging with either a first recess 15 of the terminal box 2 retaining the locking element 11 in the first position, or a second recess 16 of the terminal box 2 retaining the locking element 11 in the second position. The first and second recess 15, 16 form part of the cavity 12. The latch 13 is at the end of a resilient arm 14 so that the resilient arm 14 allows the latch 13 to be caromed out of the first or second recess 15, 16 by pushing the arm backward during movement of the locking element 11. As can be seen from FIGS. 6 to 9, the other end of the arm 14 extends into a root portion 53 that is integrally formed with a central core portion 11a of the locking element 11. The central core portion 11a extends along the full axial length of the locking element 11 and forms its main part. There is a free space 52 between the arm 14 and the central core portion 11a enabling the resilient backward movement of the latch 13 and the arm 14 toward the core portion 11a.

The latch 13 has a leading portion 53 or head of rounded shape that continues into a tangential surface 56 that progressively moves away from the arm 14 and then merges into a detention surface 57 that in turn extends toward the arm 14. Consequently, the overall outer shape of the latch 13 is a kind of a duck's head that acts like a hook. The detention surface 57 of the latch 13 interacts with a front inner side wall 36 of the first recess 15 that is plain and perpendicular to the direction of movement of the locking element 11 (see FIG. 5) to retain the latch 13 within the first recess 15. Thus, this front inner side wall 36 is an abutment and, in cooperation with the detention surface 57, limits movement of the locking element 11 beyond the first position when it is moved from the second to the first position. In other words, the front inner side wall 36 prevents the latch 13 being moved out of or falling out of the cavity 12.

The first recess 15 also has a rear inner side wall 35 that is configured to push the latch 13 backward to the core portion 11a (into free space 52) during movement from the first to the second position, more specifically at the beginning of this movement. As shown in FIG. 5, this rear inner side wall 35 is plain and extending at an oblique angle of about 45° with regard to the locking direction, i.e. to this movement of the locking element 11 from the first to the second position. Thus, when the locking element 11 is pushed from the first to the second position, the leading head 55 of the latch 13 is pushed against the rear inner side wall 35 of the first recess 15 that deflects the acting force toward the central core portion 11 of locking element, resulting, thanks to the resilience of the arm 14, in an evasive action of the latch 14. It follows that, the latch 14, with progressive movement of the locking element 11 into the cavity 12, slides along the rear inner side wall 35 that pushes the latch 13 increasingly backward to the core portion 11a of the locking element 11 thereby bending the arm 14. Consequently, the latch 13 moves more and more out of the first recess 15.

In a corresponding manner, the second recess 16 that is situated behind the first recess viewed from the front face 23 of the terminal box 2 has a front inner side wall 34 and a rear inner side wall 33. This rear inner side wall 33 has a shape that corresponds substantially to that for the leading rounded head 53 forming an end stop for the locking element 11. This front inner side wall 34 is configured to push the latch 13 backward during movement from the second to the first position, more specifically at the beginning of this movement. As shown in FIG. 5, this front inner side wall 34 is planar and extends at an oblique angle of about 45° with regard to the unlocking direction, i.e. to this movement of the locking element 11 from the second to the first position. Thus, when the locking element 11 is pulled to move from the second to the first position, the detention surface 57 of the latch 13 is pushed against the front inner side wall 34 of the second recess 16 that deflects the acting force toward the central core portion 11a of the locking element 11, resulting, thanks to the resilience of the arm 14, in an evasive action of the latch 13. It follows that, the latch 14, with progressive movement of the locking element 11 out of the cavity 12, slides along the front inner side wall 34 that pushes the latch 13 increasingly backward to the core portion 11a of the locking element 11 thereby bending the arm 14. Consequently, the latch 13 moves more and more out of the second recess 16.

In order to form the first and second recess 15, 16 by injection molding, core elements are used that leave residual holes 40 in the top of the terminal box 2.

At a second side 11c (see FIG. 6), that is, here, opposite to the first side 11b, the locking element 11 is configured as to give free way for mounting the module 3 in the first position, and arresting the module 3 in the second position. The latter is achieved by two projecting locking bars 17, 18, spaced apart from each other, one bar 17, 18 for engaging with each one of the two adjacent posts 20a, 20b.

As can be seen from FIGS. 6 to 9, the locking element 11 has an overall longitudinal shape. It has the central core portion 11a at opposing sides 11b, 11c of which are arranged the locking bars 17, 18 and the latch 13 with arm 4. In other words, the central core portion 11a described between the projecting bars 17, 18 and the latch, 13. The cross section of the central core portion 11a is substantially rectangular. The bars 17, 18 project from the central core portion 11a at opposing axial ends so as to form a front bar 17 and rear bar 18, defining a free space 19 between them. In the first position, this free space 19 is aligned with the front hole 21 to leave the front post 20a pass. In the second position, the front bar 18 engages into the notch 24 of the front post 20a and the rear bar 17 engages into the notch 24 of the rear post 20b thereby arresting the posts 20a, 20b from being removed.

In the combined top area of the front bar 17 and core portion, a first and second mark 43, 44 is embossed. The first mark 43 is a direction indicator 43, in this example in form of a triangle, indicating the direction of movement of the locking element 11 for locking the module 3. The second mark 44 is a position indicator 44, in this example in form of a bar, indicating the position of the locking element 11. It helps to verify if the locking element 11 has correctly reached the first position for unplugging the module.

The underside 45 of the central core portion 11a of the locking element 11 forms a sliding surface. This underside 45 is slidable on a guide track 59 at the lower side of the cavity 12, shown in FIGS. 14 and 16 to 19. The guide track 59 is a plan surface delimiting the cavity 12, supporting the locking element 11 and contributing to keep it in position. The central core portion 11a lay within the guide track 59 in a form-fit manner.

At the front axial end, the head 29 of the locking element 11 is formed by an end area of a central core portion 11a, a left side wing 49 and a right side wing 48. The side wings 48, 49 project from the central core portion 11a at opposing sides, thereby enlarging the axial face of the central core portion 11a to form an operating surface comfortable to act on with a thumb, for example. Between the left side wing 49 and the root portion 53 of the arm 14 there is the free space 28 in order to position the flat end of the tool behind the left side wing 49 and to act on its back surface 50 for levering the locking element 50 out of the cavity 12. For that, the tool props at the inclined inner wall of the window extension area 26 whereas the flat end of the tool pulls the locking element off the cavity by exerting a pushing force against the back surface. This back surface 50 is inclined in the locking direction so that the flat end of the tool can get in planar contact.

Figure 23:
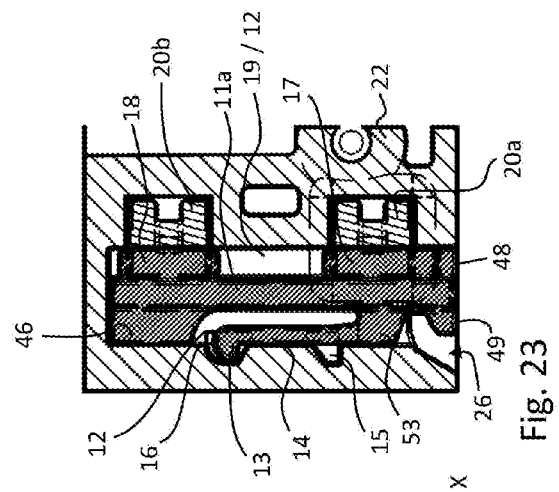
FIG. 23 is an axis-parallel cross-sectional view of the left side of the assembly of FIG. 1 when latched, taken along section line XXIII-XXIII in FIG. 20.
Figure 22:
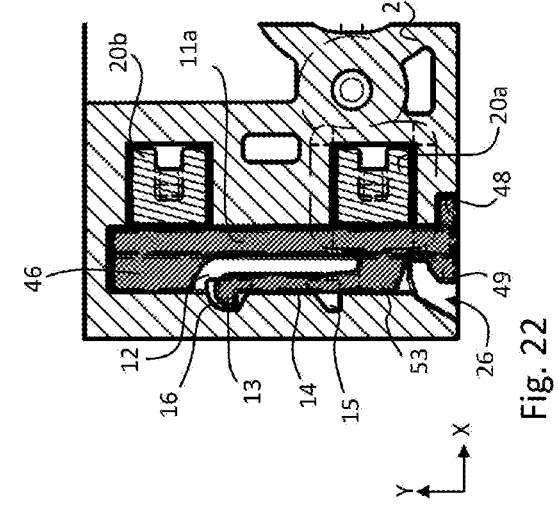
FIG. 22 is an axis-parallel cross-sectional view of the left side of the assembly of FIG. 1 when latched, taken along section line XXII-XXII in FIG. 20.
Figure 21:
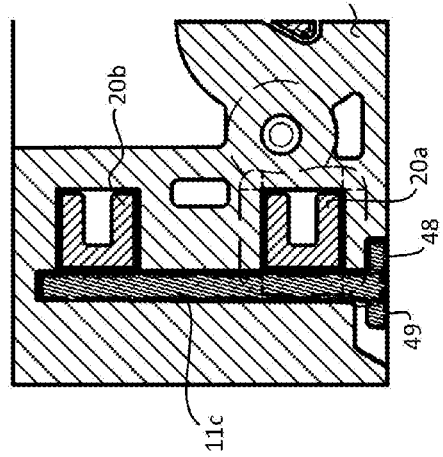
FIG. 21 is an axis-parallel cross-sectional view of the left side of the assembly of FIG. 1 when latched, taken along section line XXI-XXI in FIG. 20.

The back surface 51 of the right side wing 48 is parallel to the head's front face 29. This back surface 51 contacts, in the second position, a right side rear wall 61, as can be seen in FIGS. 21 to 23. In front of the right side rear wall 61 there is a space for accommodating the right side wing 49.

At the side 11b of the central core portion 11a opposing rear bar 18 a guiding portion 46 projects from the central core portion 11a that guides the rear end of the locking element 11. The underside 47 of this guiding portion 46 is stepped back in comparison with the underside 45 of the central core element 11a, so that solely this underside 45 of the central core element 11a is enclosed within the guide track 59.

As can be seen in FIGS. 7, 9 and 10, the uttermost edge 58 of latch 13 is inclined in that the top surface extends beyond the bottom surface. Correspondingly, the inner wall 64 portion of the second recess 16 (see FIG. 5) facing latch's inclined edge 58 is inclined as well, as can be seen in FIG. 18.

FIGS. 11 to 23 give a more detailed view of the mounting mechanism according to the present invention using axial and radial cross sections through the assembly 1 where FIGS. 11 to 14 refer to the unlocked state and FIGS. 15 to 23 refer to the locked state.

FIG. 11 designates a line xii-xii defining a horizontal cross section at a height z crossing the posts 20a, 20b below the notch 24. The respective cross-sectional view along line xii-xii is given in FIG. 12.

In FIG. 12, the rear part of cavity 12 is visible as the locking element is in the first position, partly extending into the cavity 12 and partly projecting from the front face 23 of the terminal box 2 the upper portion 22 of which is cut in FIG. 12. This upper portion forms a base frame. The cavity 12 is provided within that base frame. The latch 13 engages with the first recess 15. In the rear part of cavity 12, you can see the linear guide track 59 as well as an elevated bottom area 60 of the cavity 12 supporting the guiding portion 46. FIG. 13 designates a line xiv-xiv defining a vertical cross section at a depth y centrally crossing the front post 20a. The respective cross-sectional view along line xiv-xiv is given in FIG. 14.

FIG. 14 shows the guide track 59 bordering the central core portion 11a at its bottom and forming the lowest area of the cavity 12. Next to the guide track 59, there is the elevated bottom area 60 that also supports the arm 14. In the unlocked state shown in FIG. 14, no physical component engages with the notch 24 as the free space 19 coincide with the notch 24 giving free view to the lateral face of the rear bar 18 that is located between the front post 20a and rear post 20b as shown by broken lines in FIG. 13.

FIG. 15, showing the locked state of the assembly 1, designates
a first line XVI defining a vertical cross section at a depth y centrally crossing the front post 20a;
a second line XVII defining a vertical cross section at a depth y between the first and second recess 15, 16 and between the front and rear post 20a, 20b;
a third line XVIII defining a vertical cross section at a depth y centrally crossing the second recess 16, and
a fourth line xix defining a vertical cross section at a depth y centrally crossing the rear post 20a, The cross-sectional view along first line XVI is given in FIG. 16, along second line XVII is given in FIG. 17, along third line XVIII is given in FIG. 18 and along fourth line XIX is given in FIG. 19.

As can be seen from FIG. 16, in the second position of the locking element 11, i.e. the locked state, the front bar 17 engages the notch 24 of the front post 20a. Simultaneously, as shown in FIG. 19, the rear bar 18 engages the notch 24 of the rear post 20b. As can be seen in FIGS. 17 and 18, the cavity 12 has a side compartment for the locking bars 17, 18, that extends parallel to the central core portion 11a and that is aligned with the notches 24 in the posts 20a, 20b. In FIGS. 17 and 18, the free space 19 coincide with this side compartment.

Besides, in FIG. 18, you can see the latch 13 engaging with the second recess 16. The bottom area 63 of the second recess 16 is lower than the elevated bottom area 60 of the cavity 12 supporting the guiding portion 47, and is higher than the bottom area of the guide track 59. This has the advantage that small particles that may fall through the residual hole 40 of the second cavity are collected at the lower bottom area 63 and will not block the engagement of the latch 13 and the second recess 16.

Figure 20:
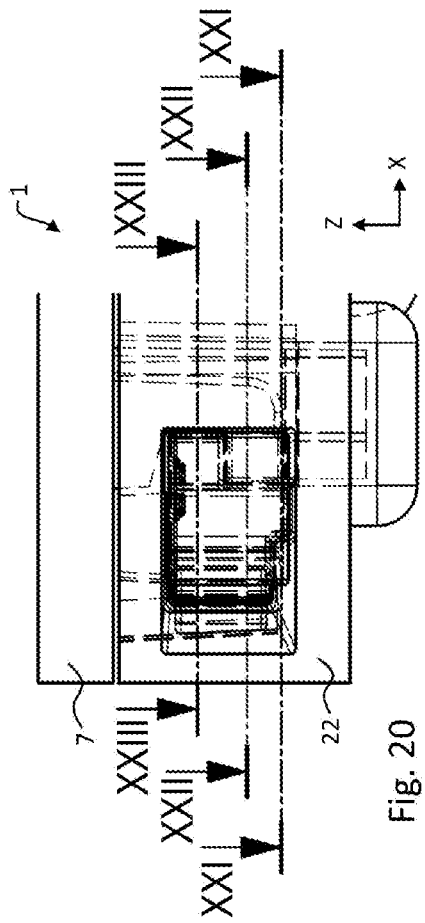
FIG. 20 is an enlarged front view of the left side of the assembly of FIG. 1 when latched showing section lines XXI-XXI, XXII-XXII, XXIII-XXIII at different radial height positions.

FIG. 20, also showing the locked state of the assembly 1, designates
a first line XXI-XXI defining a horizontal cross section at a height z of the guide track 59 and crossing the posts 20a, 20b below the notch 24;
a second line XXII-XXII defining a horizontal cross section at a height z crossing the posts 20a, 20b below the notch 24, and
a third line XXIII-XXIII defining a horizontal cross section at a height z crossing the posts 20a, 20b and their notches.

The cross-sectional view along first line XXI-XXI is given in FIG. 21, along second line XXII-XXII is given in FIG. 22 and along third line XXIII-XXIII is given in FIG. 23.

Considering FIGS. 21, 22 and 23 in conjunction, you can see that in the lower (FIG. 21) and middle (FIG. 22) area of the cavity there is no interaction between the locking element 11 and the posts 20a, 20b. Interaction, however, is present in the upper area of the cavity 12 as can be seen from FIG. 23 where the locking bars 17, 18 engages with the post's notches 24 so as to arrest the posts 20a, 20b and to prevent the module 3 being removed from the terminal box 2.

Figure 24:
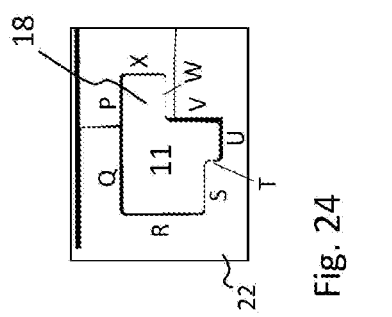

Simplified radial cross sections of the locking element 11 and surrounding base frame 22 are presented in FIGS. 24 and 25 in order to explain the functions of the different outer surfaces or surface portions of the locking element 11. FIG. 25 corresponds to the line XIX in FIG. 19 whereas FIG. 24 shows a radial cut immediately behind the post 20b. The cross sectional outer shape of the locking element 11 is defined by the surface areas p, q, r, s, t, u, v, w and x that are rectangular or parallel to each other. In FIG. 24, surface areas w-t-q prevent a clockwise rotation of the locking element 11 as they are opposed to this direction. Surface areas p-s-v prevent an anti-clock wise rotation of the locking element 11 as they are opposed to this direction. Surface areas p-q form a robust end-stop against module pulling action. In FIG. 25, only surface areas t-q are opposing a clockwise rotation of the locking element 11, whereas surface area w forms a robust end stop in front of the lower section of the post 20b which is located below notch 24. Furthermore, only surface area s is opposed to the anti-clockwise rotation of the locking element 11 as surface areas p and v have no function. Finally, only surface area q forms a robust end-stop against module pulling action as surface area p is in front of nothing as it is directed to hole 21.

In summary, the mounting mechanism according to the present invention is particularly characterized as follows:

The concept is based on the cooperation of a male and a female part where the assembly 1 is locked when the male part engages the female part, and unlocked when the male and female part are out of engagement.

The male part is formed by the locking element 11 that is sliding inside the female part.

The female part is formed, on one hand, by the base fame 22 that surrounds the cavity 12, and on the other hand, by the removable notched post 20a that is a kind of a hook. The presence or absence of the locking bar 17, 18 within the notch 24 of the post 20a, 20b give the functionality.

The locked position is given by the spring effect of the arm 14 and by the friction between locking element 11 and base frame 22. Movement between the first and second position is facilitated by 45° inclined inner walls 34, 35 of the first and second recess 15, 16 giving the latch 13 the possibility to slide and snap into the respective first or second recess 15, 16. The unlocked position is defined by the latch's 13 detention surface 57 and the inner walls 36 of the first recess 15 both of which having an angle of 90° with respect to the locking element's direction of movement.

The inner walls 36 forms an end stop for the latch 13 and stops movement of the locking element 11 in open location. All inner walls 34, 35, 36 with particular function are part of the base frame 22.

It should be noted that the foregoing description is given merely by way of example for purposes of illustration and in no way limits the scope of protection of the invention. Features of the invention shown as "can," "may," "exemplary," "preferred," "optional," "ideal," "advantageous" or "suitable" are to be considered purely optional and likewise do not limit the scope of protection that is defined exclusively by the claims. To the extent that the foregoing description recites elements, components, process steps, values or information having known, obvious or foreseeable equivalents, such equivalents are embraced by the invention. Likewise, the invention includes any changes, variations, or modifications to embodiments that have as their object the substitution, addition, alteration, or omission of elements, components, process steps, values, or information, so long as the basic idea of the invention is maintained, regardless of whether the change, variation, or modification results in an improvement or deterioration of an embodiment.

Although the foregoing description of the invention mentions a variety of physical, non-physical or process features in relation to one or more specific embodiment(s), these features may also be used in isolation from the specific embodiment, at least to the extent that they do not require the mandatory presence of further features. Conversely, these features mentioned in relation to one or more specific embodiment(s) may be combined as desired with each other as well as with further disclosed or non-disclosed features of shown or non-shown embodiments, at least insofar as the features are not mutually exclusive or do not lead to technical incompatibilities.

The invention claimed is:

1. An assembly having:
    a terminal box for a centrifugal pump accommodating a pump control and forming a cavity;
    a module adding to the pump control at least one additional hardware and/or software function and removably mountable on the terminal box and having a base plate;
    a locking element for securely holding the module on the terminal box;
    a pluggable electric interface extending through an opening from an underside of the base plate into the terminal box to electrically connect the pump control for establishing a data link,
    wherein:
        the locking element is slidable in the cavity and is movable manually from a first position to a second position and by a tool from the second position to the first position, the locking element having on a first side a resilient latch engaging with either a first recess of the terminal box and holding the locking element when same is in the first position, or a second recess of the terminal box holding the locking element when same is in the second position, the locking element being configured to free the module for plugging-in in the first position, and to arrest the module in the second position by at least one projecting bar on a second side of the locking element, and
        the module has a post extends toward the electric interface from the base plate and is insertable through a hole into the cavity when the locking element is in the first position, the post having a notch for interfitting with the bar when the locking element is in the second position.

2. The assembly according to claim 1, wherein the latch is at the end of a resilient arm.

3. The assembly according to claim 1, wherein the module has at least one such post on each side of the electric interface, each post having a respective such notch, and the assembly further comprising a second such locking elements, the locking elements each having a respective such bar engaging, in a form-fit manner, with the notch of the respective post, when the locking element is in the second position.

4. The assembly according to claim 3, wherein the module has two such posts adjacent each other and each having a respective such notch, and the locking element is elongated and has two such adjacent projecting bars each of which engages with a respective one of the notches of the posts in a form-fit manner in the second position.

5. The assembly according to claim 1, wherein the latch has a leading head of rounded shape.

6. The assembly according to claim 1, wherein the latch is shaped as a hook and has a detention surface interacting with a front inner side wall of the first recess so as to be retained by the first recess.

7. The assembly according to claim 1, wherein the first recess has a front inner side wall configured to prevent the latch being moved out of the cavity.

8. The assembly according to claim 1, wherein the first recess has a rear inner side wall configured to push the latch backward during movement from the first to the second position.

9. The assembly according to claim 1, wherein the second recess has a front inner side wall configured to push the latch backward during movement from the second to the first position.

10. The assembly according to claim 1, wherein the locking element has a longitudinal shape having a central core portion at opposing sides of which are arranged the bar and the latch.

11. The assembly according to claim 1, wherein the underside of a central core portion of the locking element is slidable on a guide track on the floor of the cavity.

12. The assembly according to claim 1, wherein the locking element has, at one axial end, a head formed by an end area of a central core portion and left and right side wings projecting therefrom to opposing sides.

13. The assembly according to claim 1, wherein the cavity opens to a front face of the terminal box via a window where the locking element in the first position, projects from this outer surface, and in the second position a head of the locking element is in the window.

14. The assembly according to claim 13, wherein the window has an extension area at one side for insertion of a flat end of the tool into a space behind a side wing of the head to lever the locking element out of the cavity.

* * * * *